US008203865B2

(12) United States Patent  
Tian et al.

(10) Patent No.: US 8,203,865 B2
(45) Date of Patent: Jun. 19, 2012

(54) NON-VOLATILE MEMORY CELL WITH NON-OHMIC SELECTION LAYER

(75) Inventors: Wei Tian, Bloomington, MN (US); Insik Jin, Eagan, MN (US); Venugopalan Vaithyanathan, Bloomington, MN (US); Haiwen Xi, San Jose, CA (US); Michael Xuefei Tang, Bloomington, MN (US); Brian Lee, Boston, MA (US)

(73) Assignee: Seagate Technology LLC, Scotts Valley, CA (US)

( * ) Notice: Subject to any disclaimer, the term of this patent is extended or adjusted under 35 U.S.C. 154(b) by 0 days.

(21) Appl. No.: 13/087,087

(22) Filed: Apr. 14, 2011

(65) Prior Publication Data

US 2011/0188293 A1    Aug. 4, 2011

Related U.S. Application Data

(63) Continuation of application No. 12/502,222, filed on Jul. 13, 2009, now Pat. No. 7,936,585.

(51) Int. Cl.
*G11C 11/00* (2006.01)

(52) U.S. Cl. .................. 365/148; 365/163; 365/175

(58) Field of Classification Search .................. 365/148, 365/113, 163, 158, 171, 175
See application file for complete search history.

(56) References Cited

U.S. PATENT DOCUMENTS

| | | | |
|---|---|---|---|
| 5,278,636 A | 1/1994 | Williams | |
| 6,121,642 A | 9/2000 | Newns | |
| 6,624,463 B2 | 9/2003 | Kim et al. | |
| 6,653,704 B1 | 11/2003 | Gurney et al. | |
| 6,667,900 B2 | 12/2003 | Lowrey et al. | |
| 6,753,561 B1 | 6/2004 | Rinerson et al. | |
| 6,781,176 B2 | 8/2004 | Ramesh | |
| 6,917,539 B2 | 7/2005 | Rinerson et al. | |
| 7,236,394 B2 | 6/2007 | Chen et al. | |
| 7,936,585 B2 * | 5/2011 | Tian et al. .................. | 365/148 |
| 2004/0114413 A1 | 6/2004 | Parkinson et al. | |
| 2004/0257878 A1 | 12/2004 | Morikawa et al. | |
| 2006/0073652 A1 | 4/2006 | Pellizzer et al. | |
| 2006/0131554 A1 | 6/2006 | Joung et al. | |
| 2007/0115749 A1 | 5/2007 | Gilbert | |
| 2008/0094873 A1 | 4/2008 | Lai et al. | |
| 2009/0052225 A1 | 2/2009 | Morimoto | |
| 2009/0072246 A1 | 3/2009 | Genrikh et al. | |
| 2010/0078620 A1 | 4/2010 | Xi et al. | |
| 2010/0149856 A1 | 6/2010 | Tang | |

(Continued)

OTHER PUBLICATIONS

Andriy Romanyuk, Roland Steiner, Laurent Marot & Peter Oelhafen, "Temperature-induced metal-semiconductor transition in W-doped VO2 films studied by photoelectron spectroscopy," Solar Energy Materials and Solar Cells, 2007, pp. 1831-1835, No. 91, Elsevier, Switzerland.

(Continued)

*Primary Examiner* — Gene Auduong
(74) *Attorney, Agent, or Firm* — Hall Estill Attorneys at Law

(57) ABSTRACT

A non-volatile memory cell and associated method is disclosed that includes a non-ohmic selection layer. In accordance with some embodiments, a non-volatile memory cell consists of a resistive sense element (RSE) coupled to a non-ohmic selection layer. The selection layer is configured to transition from a first resistive state to a second resistive state in response to a current greater than or equal to a predetermined threshold.

20 Claims, 6 Drawing Sheets

U.S. PATENT DOCUMENTS

2010/0155722 A1* 6/2010 Meyer ............................ 257/43
2010/0155953 A1* 6/2010 Bornstein ...................... 257/751
2010/0157658 A1* 6/2010 Schloss et al. ................ 365/148

OTHER PUBLICATIONS

G. Baek, M. S. Lee, S. Seo, M. J. Lee, D. H. Seo, D.-S. Suh, J. C. Park, S. O. Park, H. S. Kim, I. K. Yoo, U-In Chung and J. T. Moon, "Highly Scalable Non-volatile Resistive Memory using Simple Binary Oxide Driven by Asymmetric Unipolar Voltage Pulses," IEEE Technical Digest, 2004, pp. 587-590, IEDM.

Yi-Chou Chen, C. F. Chen, C. T. Chen, J. Y. Yu, S. Wu, S. L. Lung, Rich Liu and Chih-Yuan Lu, "An Access-Transistor-Free (OT/1R) Non-Volatile Resistance Random Access Memory (RRAM) Using a Novel Threshold Switching, Self-Rectifying Chalcogenide Device," IEEE Technical Digest, 2003, pp. 905-908, IEDM.

Choony-Rae Cho, Sungii Cho, Sidorkin Vadim, Ranju Jung and Inkyeong Yoo, "Current-induced metal-insulator transition in VOx thin film prepared by rapid-thermal-annealing," Science Direct, 2005, pp. 375-379, Elsevier B. V.

N. F. Mott, "Metal-Insulator Transition," Review of Modern Physics, Oct. 1968, pp. 677-683, vol. 40, No. 4.

G. Stefanovich, A. Pergament and D. Stefanovich, "Electrical switching and Mott transition in VO2," J. Phys.: Condes. Matter 12, 2000, pp. 8837-8845, IPO Publishing Ltd., UK.

W. W. Zhuang, W. Pan, B. D. Ulrich, J. J. Lee, L. Stecher, A. Burmaster, D. R. Evans, S. T. Hsu, M. Tajri, A. Shimaoka, K. Inoue, T. Naka, N. Awaya, K. Sakiyama, Y. Wang, S. Q. Liu, N. J. Wu and A. Ignatiev, "Novell Colossal Magnetoresistive Thin Film Nonvolatile Resistance Random Access Memory (RRAM)," IEEE Technical Digest, 2002, pp. 193-196, IEDM.

* cited by examiner

NON-VOLATILE MEMORY CELL WITH NON-OHMIC SELECTION LAYER

BACKGROUND

Solid state memories (SSMs) often comprise one or more arrays of individually programmable memory cells configured to store data by the application of write currents to the cells to store a sequence of bits. The stored bits can be subsequently read during a read operation by applying suitable read currents and sensing voltage drops across the cells.

Some SSM cell configurations employ a logical storage bit coupled to a switching device. The resistive element can be programmed to different resistances to represent different bit states while the switching device allows selective access to the resistive sense element during read and write operations.

A continued trend is to provide SSM arrays with larger data capacities and smaller manufacturing process feature sizes. However, the physical requirements of many switching devices have made implementation of such components more difficult. Furthermore, smaller feature sizes can pose a high potential for errors when reading and writing data due to close proximity to other components and high programming current often used in modern logical storage bits.

As such, there is a continued need for improved non-volatile memory cells, specifically with respect to reducing the physical overhead of switching devices while reducing operational data access errors.

SUMMARY

Accordingly, various embodiments of the present invention are generally directed a non-volatile memory cell and associated method is disclosed that includes a non-ohmic selection layer.

In accordance with some embodiments, a non-volatile memory cell consists of a resistive sense element (RSE) coupled to a non-ohmic selection layer. The selection layer is configured to transition from a first resistive state to a second resistive state in response to a current greater than or equal to a predetermined threshold.

In accordance with other embodiments, a non-volatile memory cell is provided that consists of a resistive sense element (RSE) coupled to a non-ohmic selection layer. The selection layer is transitioned from a first resistive state to a second resistive state in response to a current greater than or equal to a predetermined threshold to the memory cell.

In yet another embodiment, a cross-point array of memory cells are arranged in rows and columns where each memory cell consists of a resistive sense element (RSE) coupled to a non-ohmic selection layer. A data access circuit is provided that is capable of transitioning the selection layer from a first resistive state to a second resistive state by applying a current greater than or equal to a predetermined threshold to the memory cell.

These and other features and advantages which characterize the various embodiments of the present invention can be understood in view of the following detailed discussion and the accompanying drawings.

DETAILED DESCRIPTION

The present disclosure generally relates to a non-volatile memory cell, and in particular a memory cell with a selection layer that selectively allows access to a resistive sense element. Prior art data storage devices often cannot reliably provide bipolar current to memory cells constructed in high density memory arrays for a number of reasons, such as the large physical space requirements of devices capable of selectively providing bipolar current. In addition, existing memory cells can add a considerable degree of complexity to a memory array that requires added processing time and power to reliable operate.

Accordingly, a memory cell that consists of a non-ohmic selection layer can provide selective access to a resistive sense element (RSE) by transitioning from a first resistive state to a second resistive state with an application of a current greater than or equal to a predetermined value to the memory cell. The ability to construct the non-ohmic selection layer in the memory cell advantageously allows for construction of high density memory arrays with scalable features.

Figure 1:
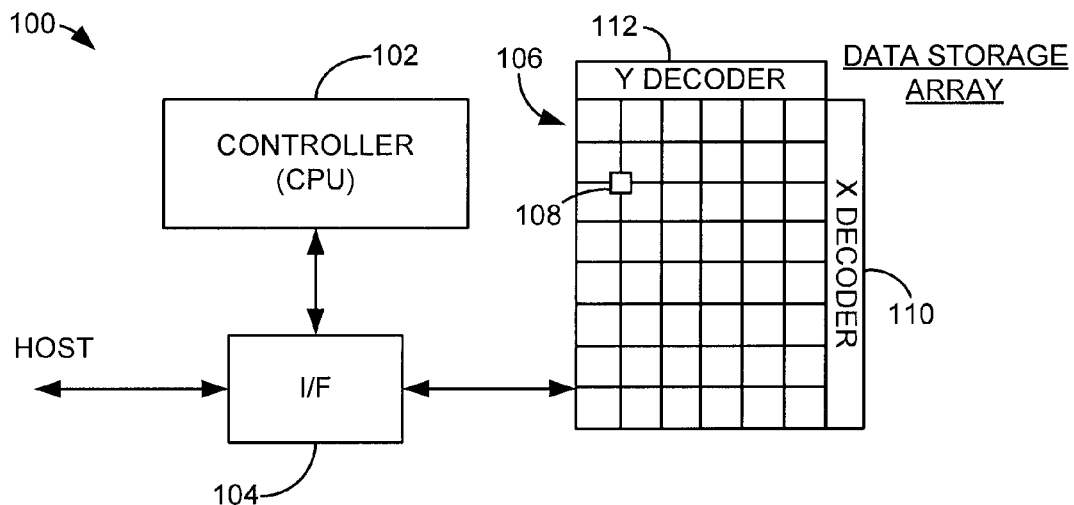
FIG. 1 is a general representation of an exemplary circuitry used to read and write data to a data storage array.

Turning to the drawings, FIG. 1 provides a functional block representation of a data storage device 100 constructed and operated in accordance with various embodiments of the present invention. The device 100 includes a top level controller 102, an interface (I/F) circuit 104 and a data storage array 106. The I/F circuit 104 operates under the direction of the controller 102 to transfer user data between the array 106 and a host device (not shown).

In some embodiments, the device is characterized as a solid-state drive (SSD), the controller 102 is a programmable microcontroller, and the array 106 comprises an array of nonvolatile memory cells 108. In other embodiments, the data storage array 106 can have separate X and Y decoders 110 and 112, respectively, to provide access to selected memory cells 108. However, the configuration and operation of the various components of the data storage device 100 are not required or limited and can be modified, as desired.

Figure 2:
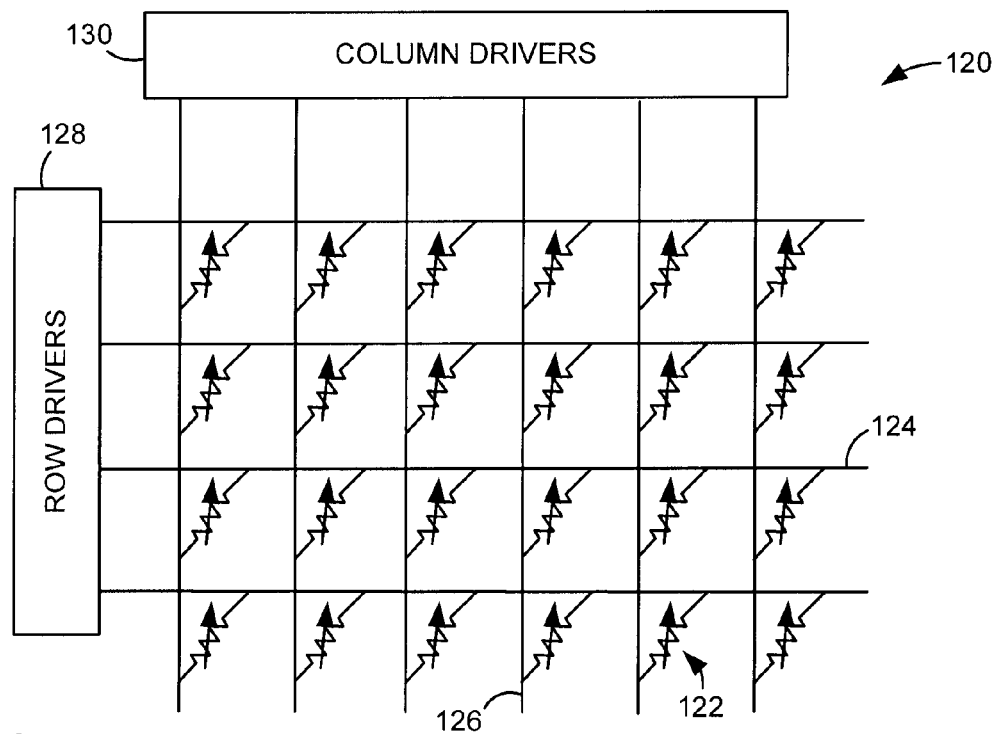
FIG. 2 displays an exemplary cross-point array of memory cells capable of being used as the data storage array of FIG. 1.

FIG. 2 displays a cross-point array of memory cells 120 capable of providing access to one or more memory cells. The cross-point array 120 can be constructed with a number of memory cells 122 arranged in rows and columns defined by row control lines 124 and column control lines 126. The respective row and column control lines 124 and 126 can be individually or collectively manipulated with a row driver 128 and column driver 130, respectively. It should be noted that while a single driver can be used to control a plurality of row or column control lines 124 and 126, such configuration is not required or limited and any number of row or column drivers can be used to operate the cross-point array of memory cells 120, as desired.

However, operation of the cross-point array of memory cells 120 can produce unwanted current during data access operations. For example, an unwanted current can be produced along a selected row and column control lines 124 and 126 due to the potential difference between precharged unselected memory cells and the voltage created by the row control line driver 128. As such, the higher number of memory cells connected to the selected bit line can result in an increased probability of error when accessing a predetermined memory cell.

Figure 3:
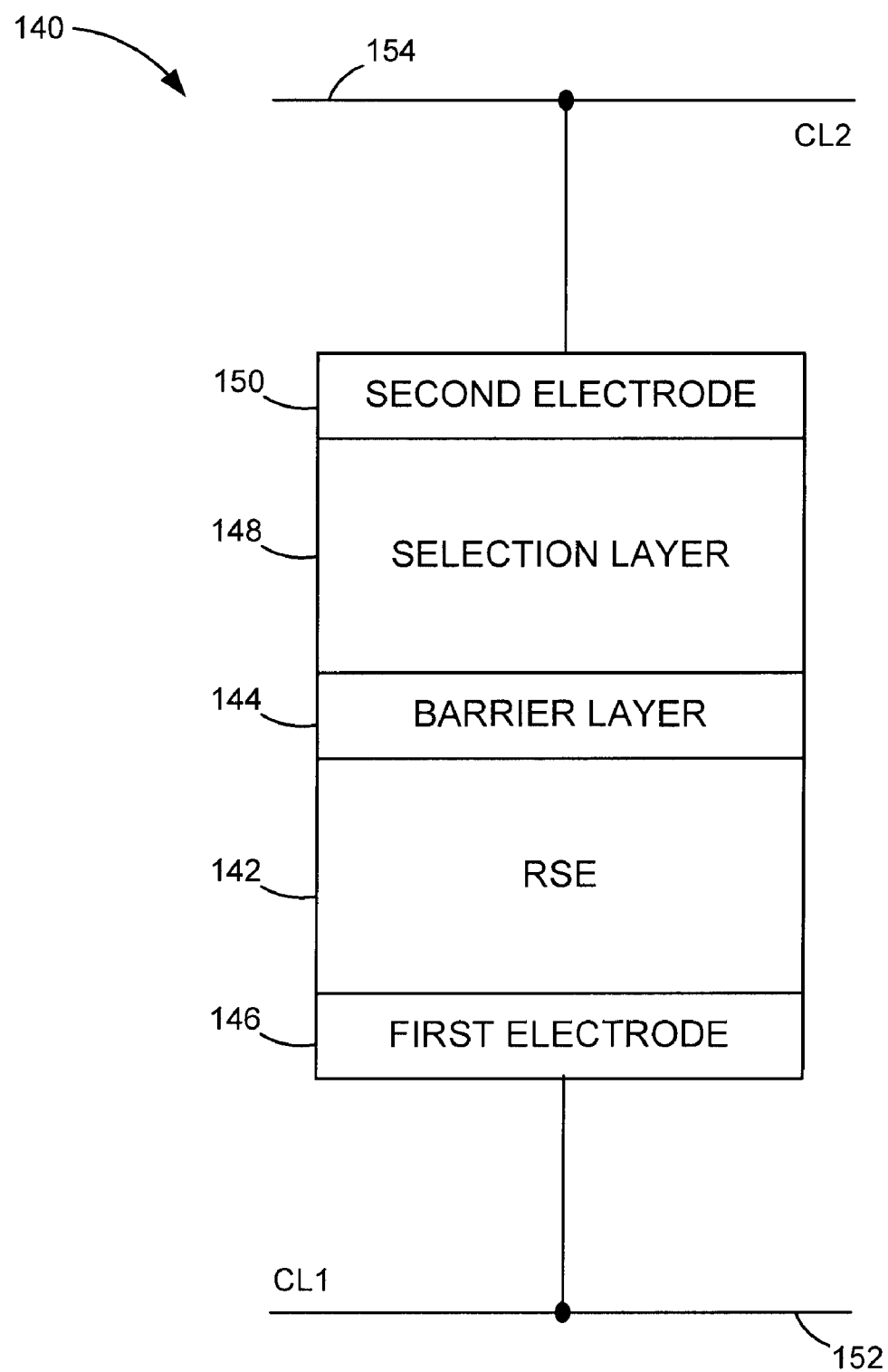
FIG. 3 shows an exemplary memory cell constructed in accordance with various embodiments of the present invention.

FIG. 3 displays an exemplary memory cell 140 constructed in accordance with various embodiments of the present invention. A resistive sense element (RSE) 142 is coupled to a barrier layer 144 on one side and a first electrode 146 on the opposing side. The memory cell also has a selection layer 148 that is positioned between the barrier layer 144 as well as a second electrode 150. The first and second electrodes 146, 150 are each connected to a first and second control lines 152 and 154, respectively.

In some embodiments, the RSE 142 is bipolar in that it can be programmed to first resistive state by passing a write current through the RSE in a first direction and programmed to a second resistive state by passing a write current through the RSE in a second direction. Further in some embodiments, the selection layer 148 is constructed as a metal-insulator material that exhibits a high resistive state and no conductivity unless a current greater than or equal to a predetermined threshold is present. However, once the predetermined threshold is reached, the selection layer 148 transitions to a low resistive state that is conductive and allows the current to pass through the memory cell 140 including the RSE 142.

It should be noted that any metal-insulator transition material can be used in the memory cell 140 to selectively allow bipolar current to pass through the RSE 142 in opposing direction. In an exemplary operation, a current greater than the threshold value transitions the selection layer 148 from a low resistive state to a high resistive state that conducts the current through the barrier layer 144 and RSE 142 to program a predetermined resistive state to the RSE 142.

Once the current passes through the memory cell 140 and the selection layer 148 no longer has a current greater than or equal to the predetermined threshold, the selection layer 148 transitions from the low resistive state to the high resistive state to effectively prevent access to the RSE from either control line 152 or 154. That is, the selection layer 148 automatically returns to the high resistive state in response to the amount of current or voltage present in the memory cell dropping below the predetermined threshold. Thus, a separate signal to transition the selection layer 148 to a non-conductive high resistive state is not needed.

Furthermore, the selection layer 148 can be constructed with doped metal-insulator transition materials that respond to electric current or voltage and do not require elevated temperatures to transition between resistive states. Such dopant elements can be, but are not limited to, Chromium, Titanium, and Tungsten, while the metal-insulator materials can be, but are not limited to, $VO_2$, $VO$, $VO_x$, and $Ti_2O_3$. It has been observed that the operational behavior of such doped metal-insulator transition materials can provide advantageous threshold values that correspond to large margins between low and high resistive states. That is, a stable threshold value can correspond to a low resistive state that is easily distinguishable from the high resistive state.

In various other embodiments, the selection layer 148 is constructed from a chalcogenide such as, but not limited to, $Ge_2Sb_2Te_5$ that exhibits similarly advantageous operational characteristics. It has further been contemplated that various techniques can be utilized to construct the memory cell 140 including, but not limited to, sputtering, chemical vapor deposition (CVD), physical vapor deposition (PVD), and molecular beam epitaxy (MBE). Similarly, the construction of the barrier layer 144 is not limited to a particular material and can be various materials such as pure Tantalum, TiN, TaN, and TiW.

It should further be noted that while a single selection layer 148 is displayed, construction of the memory cell 140 is not limited to such configuration and can comprise a number of different selection layers. Additionally, the single selection layer 148 can be constructed with multiple independent metal-insulator materials that provide advantageous operational characteristics.

Figure 4:
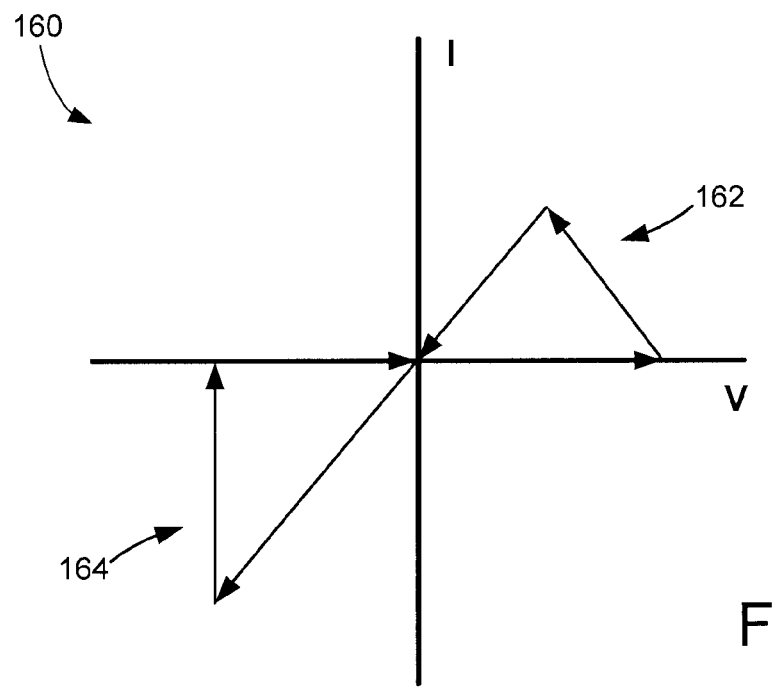
FIG. 4 generally graphs exemplary power characteristics of a resistive sense element in accordance with various embodiments of the present invention.

FIG. 4 generally graphs exemplary power characteristics 160 of a resistive sense element capable of being constructed in the memory cell 140 of FIG. 3. In various embodiments of the present invention, a bipolar RSE is used that is programmed to different resistive states with current that flows through the RSE in opposing directions. An exemplary current having a positive polarity is shown by line 162 as a resistive state is programmed to the RSE. As displayed, an increase in voltage with no corresponding current transitions to a write current with a correlating voltage drop. Subsequently, the RSE returns to an operational position with no current or voltage present. However, the programmed resistive state remains in the RSE and can be easily correlated to a logical state for data processing purposes.

Conversely, a negative polarity current, shown by line 164, functions, in an exemplary operation, to provide a negative current and voltage to the RSE to program a resistive state and then transition to a zero current without any recognizable loss in voltage. Similarly to the programming of the RSE with the positive polarity current, the negative polarity current 184 returns to a zero current and voltage state and the programmed resistive state remains present in the RSE.

It can be appreciated that the bipolar characteristics of an RSE can be exhibited by multiple different resistive sense technologies such as, but not limited to, resistive filament formation, magnetic switching, spin-polarized magnetic switching, and ionic filament formation.

Figure 5:
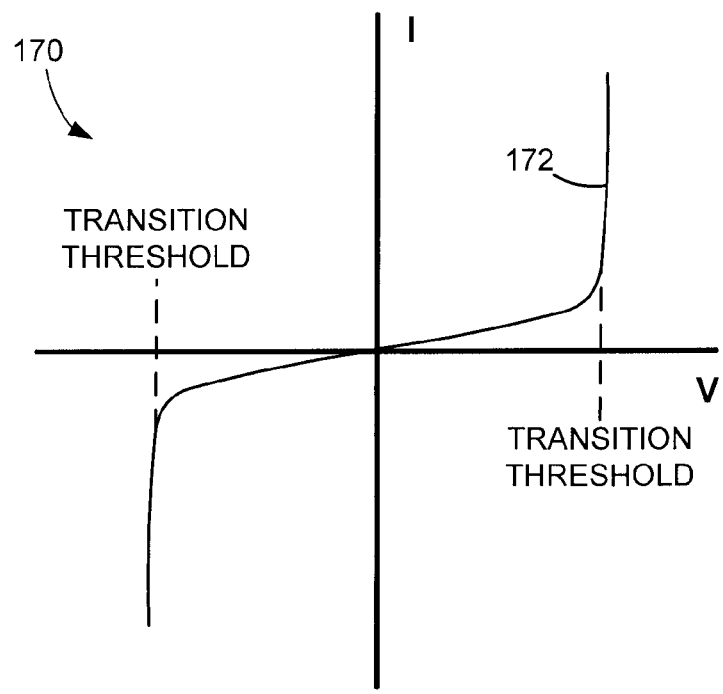
FIG. 5 graphs exemplary power characteristics of a selection layer in accordance with various embodiments of the present invention.

A graph of exemplary power characteristics 170 of a selection layer capable of being constructed in the memory cell 140 of FIG. 3 is generally presented in FIG. 5. The power line 172 exhibits that until a transition threshold is reached, either with a positive or negative polarity current, an appreciable amount of current will not flow through the selection layer. Thus, while a current may be present in the electrodes or control lines of a memory cell, until the transition threshold is reached and the selection layer transitions from a high resistive state to a low resistive state, no current will flow through the RSE.

As a result, the operational characteristics of the selection layer effectively prevent the inadvertent programming of an RSE. Hence, any unwanted current generated in a cross-point array of memory cells will be prevented from manipulating the existing programmed resistive states of unselected memory cells.

Figure 6:
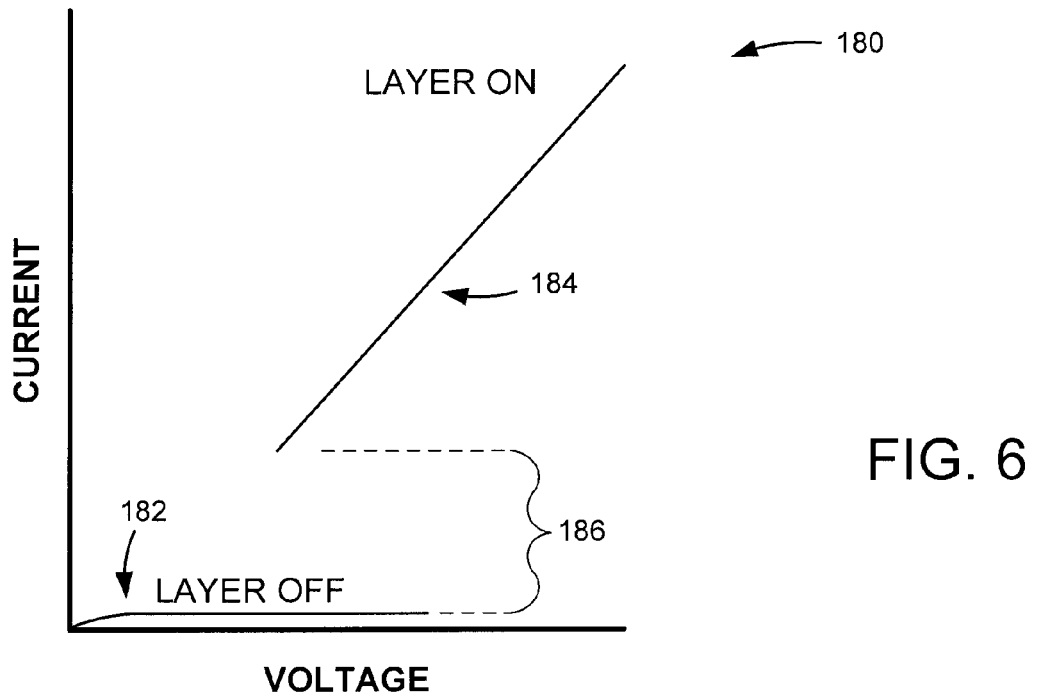
FIG. 6 generally illustrates exemplary operational characteristics of a memory cell in accordance with various embodiments of the present invention.

FIG. 6 generally further graphs exemplary operational characteristics 180 of a selection layer capable of being used in the memory cell 140 of FIG. 3. When the selection layer is transitioned to a low resistive state, it is effectively "on" and can conduct current through the memory cell. In contrast, without the presence of a current greater than or equal to the transition threshold, the selection layer is effectively "off." Specific layer off power characteristics are shown by line 182. The low current despite the presence of significant voltage corresponds to the lack of a current equal to or greater than the predetermined transition threshold.

Meanwhile, the presence of a current equal to or greater than the predetermined transition threshold will turn the selection layer on and continually conduct current, as displayed by line 184. It should be noted that the margin 186 between the layer on and layer off lines advantageously allows for affirmative selection of a particular memory cell without concern for errors corresponding to failure to activate.

Figure 7:
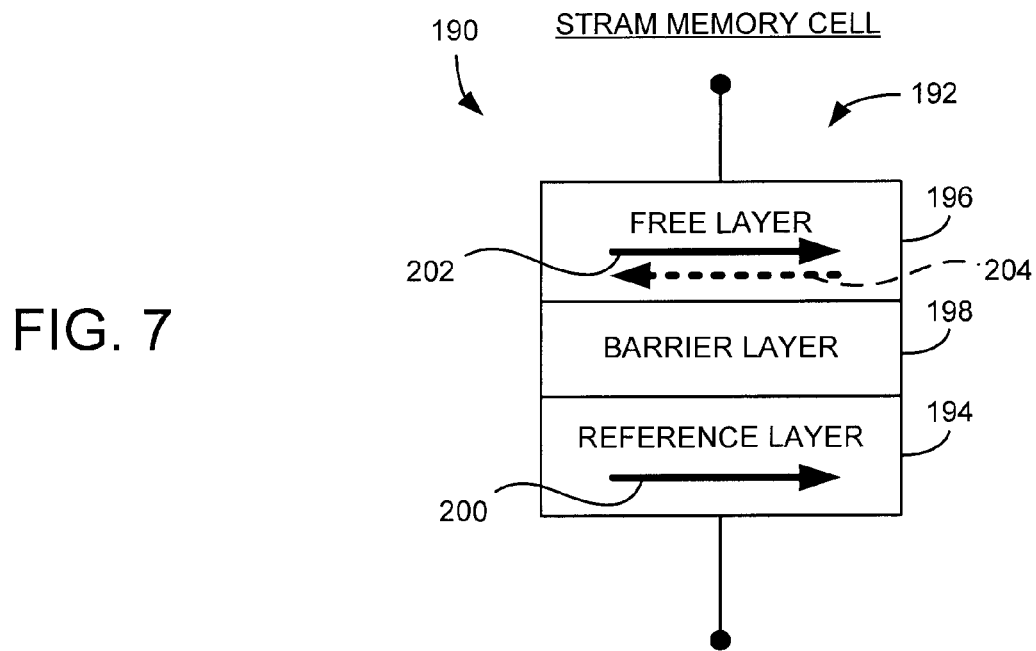
FIG. 7 shows an exemplary spin torque transfer random access memory (STRAM) cell.

In FIG. 7, an exemplary resistive sense element 190 is shown as constructed and operated in accordance with various embodiments of the present invention. In some embodiments, the RSE is bipolar. Furthermore, the RSE can be a spin-torque transfer random access memory (STRAM) configuration, as illustrated. The RSE 190 can be characterized as a magnetic tunneling junction (MTJ) 192 with a fixed reference layer 194 and a programmable free layer 196 (recording layer) separated by an intervening tunneling (barrier) layer 198. The reference layer 194 has a fixed magnetic orientation in a selected direction, as indicated by arrow 200. This fixed magnetic orientation can be established in a number of ways, such as via pinning to a separate magnet (not shown).

The free layer 196 has a selectively programmable magnetic orientation that can be parallel (solid arrow 202) or anti-parallel (dotted arrow 204) with the selected direction of the reference layer 194. Other respective magnetization orientations can be used, as desired. In operation, a low resistance state for the RSE 190 is achieved when the magnetization of the free layer 196 is oriented to be substantially in the same direction (parallel) as the magnetization of the reference layer 194. To orient the RSE 190 in the parallel low resistance state, a write current passes through the RSE so that the magnetization direction of the reference layer 194 sets the magnetic orientation of the free layer 196.

A high resistance state for the RSE 190 is established in the anti-parallel orientation in which the magnetization direction of the free layer 196 is substantially opposite that of the reference layer 194. To orient the RSE 190 in the anti-parallel resistance state, a write current passes through the RSE from the reference layer 194 to the free layer 196 so that spin-polarized electrons flow into the free layer in the opposite direction.

Figure 8:
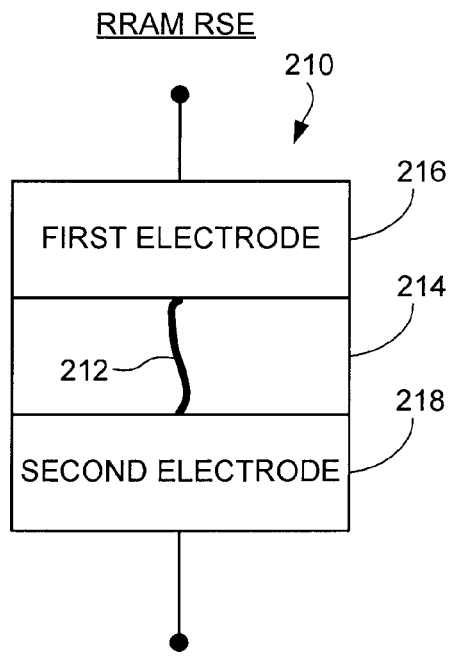
FIG. 8 provides an exemplary resistive random access memory (RRAM) cell.

FIG. 8 further shows an exemplary resistive sense element 210 as constructed and operated in accordance with various embodiments of the present invention. In some embodiments, the RSE is bipolar. In addition, a resistive random access memory (RRAM) configuration can be constructed so that a conductive filament 212 is selectively formed in an oxide layer 214 to transition the RSE 210 from a high resistive state to a low resistive state. The RSE 210 can be formed from opposing metal or metal alloy electrode layers 216, 218 separated by the intervening oxide layer 214. In some embodiments, the oxide layer 214 provides the RSE with a high resistive state.

Application of a suitable programming voltage across the RSE 210 induces metal migration from one or both of the electrodes 216, 218, resulting in the formation of one or more conductive filaments 212 that extend across the oxide layer 214. The filament(s) significantly reduce the resistance of the RSE 210 to a second, low resistive state. Subsequently, the filament(s) can be retracted by the application of a second programming voltage opposite the first voltage, thereby returning the RSE to its initial, high resistance state.

Figure 9:
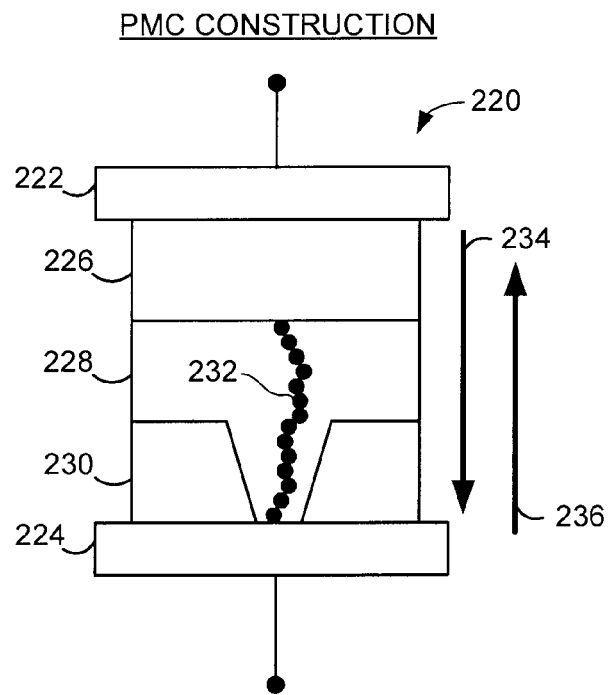
FIG. 9 displays an exemplary programmable metallization cell (PMC).

FIG. 9 generally illustrates an exemplary resistive sense element 220 capable of being constructed in the memory cell 140 of FIG. 3. In some embodiments, the RSE is bipolar. While in other embodiments, the RSE is constructed as a programmable metallization cell (PMC) configuration, as shown, that can provide retention of resistive states through the use of ionic filament formation. The PMC 220 includes top and bottom electrodes 222, 224, a metal layer 226, an electrolyte layer 228 and a dielectric layer 230. Control circuitry (not shown) can be used to adjust the relative voltage potential between the first and second electrodes 222, 224, resulting in passage of a write current 232 through the PMC 220 to form a filament 234.

The filament 234 establishes an electrically conductive path between the metal layer 226 and the bottom electrode 224 by the migration of ions from the metal layer 226 and electrons from the bottom electrode 224. The dielectric layer 230 focuses a small area of electron migration from the bottom electrode 224 in order to control the position of the resulting filament 234. The filament reduces the effective resistance of the PMC element 220 to a relatively low resistance, which can be assigned a selected logical value such as logical 1.

Subsequent application of a write current 236 in a second direction through the PMC element causes migration of the ions and electrons back to the respective electrodes 222, 224. This resets the PMC 220 to its initial high electrical resistance, which can be assigned a different logical value such as logical 0. In some embodiments, PMC with a construction similar to that shown in FIG. 9 can alternatively be programmed using unipolar programming currents of different magnitudes and/or pulse widths.

Figure 10:
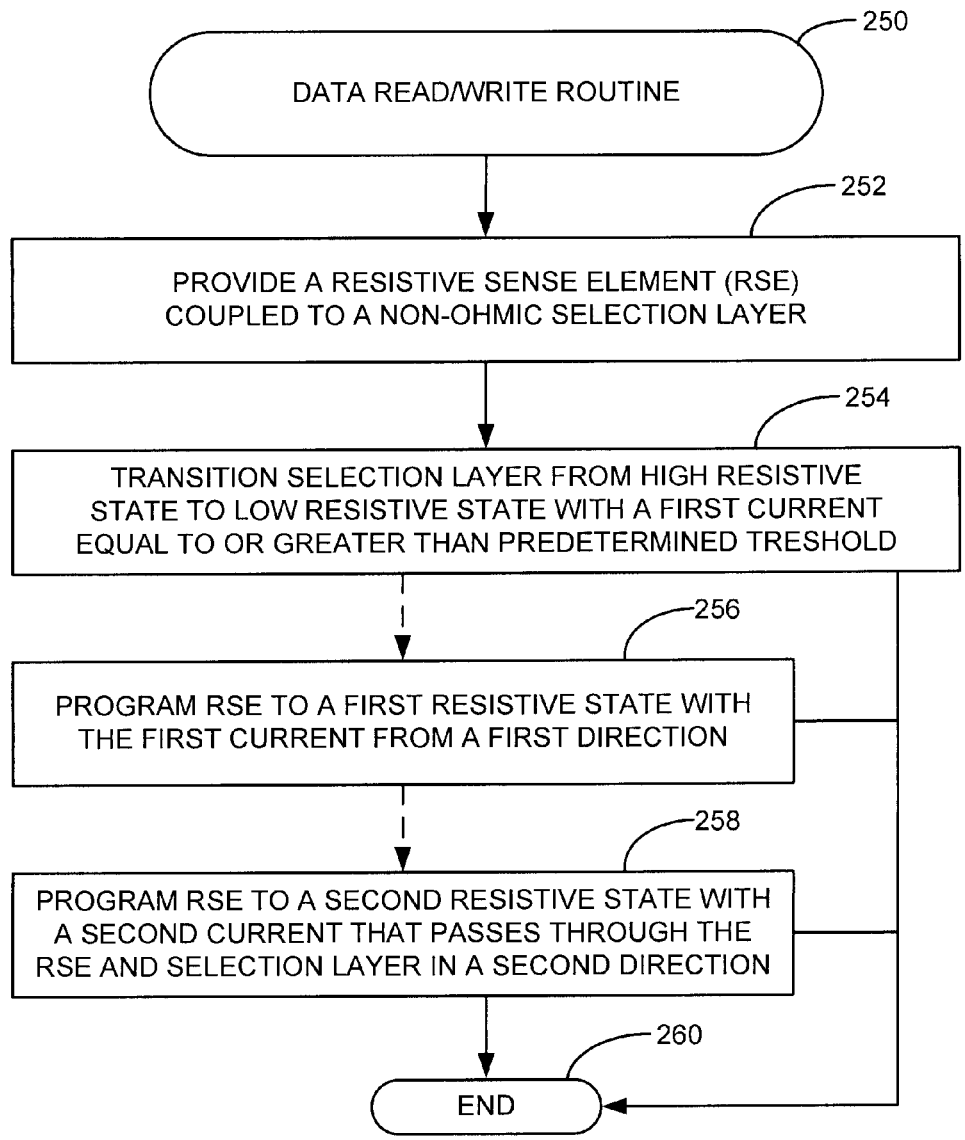
FIG. 10 provides a flowchart of an exemplary data read/write routine carried out in accordance with various embodiments of the present invention.

FIG. 10 provides a flow chart for a data read/write routine 250, generally illustrative of steps carried out in accordance with various embodiments of the present invention. At step 252, a memory cell is provided that has a resistive sense element (RSE) coupled to a non-ohmic selection layer. As discussed above, various configurations and orientation of the RSE and selection layer can be utilized. In various embodiments, a bipolar RSE is coupled to a selection layer via a barrier layer.

The selection layer is subsequently transitioned, in step 254, from a high resistive state to a low resistive state with a first current that has a magnitude greater than or equal to a predetermined threshold value. As a current greater than or equal to the threshold value remains present in the selection layer, data access is provided through the conductivity of the selection layer. However, as the amount of current drops below the predetermined threshold value, the selection layer will automatically transition from the low resistive state to the high resistive state and effectively eliminate access to the RSE and memory cell.

In optional step 256, the RSE is programmed to a predetermined resistive state, and corresponding logical state, as the first current passes through the RSE in a first direction. While the programmed resistive state is stable and capable of being continuously or successively read by a read circuit, a second resistive state could optionally be programmed to the RSE in step 258 with the application of a second current that passes through the RSE in a second direction. As can be appreciated, such second current would need to be equal to or greater than the predetermined transition threshold value of the selection layer to be allowed access to the RSE.

While any number of reading and programming steps can further be conducted on the memory cell, the data access routine 250 does not require such steps. In fact, it should be noted that the steps of the data access routine 250 are merely illustrative not limited. For example, the optional programming of resistive states to the RSE can be facilitated in any order and any number of times before, or without, programming a different resistive state to the memory cell.

As can be appreciated by one skilled in the art, the various embodiments illustrated herein provide advantages in both data storage device efficiency and complexity due to the elimination of technically challenging and physically limiting memory cell selection. The inclusion of the selection layer allows for more precise data access operations with less processing time and power. Moreover, the memory cells of the present invention can be easily scaled to be included in ever increasing high density data storage arrays. However, it will be appreciated that the various embodiments discussed herein have numerous potential applications and are not limited to a certain field of electronic media or type of data storage devices.

It should be noted that the term "non-ohmic" is directed to general operational characteristics and is not limited. That is, a non-ohmic component is one that generally does not follow Ohm's law. However, the various embodiments of the present invention can be characterized as non-ohmic by deviating from Ohm's law at any time. For example, the non-ohmic selection layer may follow Ohm's law until the application of a current above a predetermined threshold in which deviation from Ohm's law is experienced.

It is to be understood that even though numerous characteristics and advantages of various embodiments of the present invention have been set forth in the foregoing description, together with details of the structure and function of various embodiments of the invention, this detailed description is illustrative only, and changes may be made in detail, especially in matters of structure and arrangements of parts within the principles of the present invention to the full extent indicated by the broad general meaning of the terms in which the appended claims are expressed.

What is claimed is:

1. A memory cell comprising a resistive sense element (RSE) coupled to a first and second non-ohmic selection layer, wherein at least one selection layer is unipolar and doped to transition from a first resistive state to a second resistive state in response to a current greater than or equal to a predetermined threshold, the selection layer having a predetermined voltage range over which the selection layer can respectively exhibit the first resistive state and, alternatively, the second resistance state.

2. The memory cell of claim 1, wherein the first or second selection layer consists of a metal-insulator transition material.

3. The memory cell of claim 2, wherein metal-insulator transition material is characterized as bipolar.

4. The memory cell of claim 1, wherein the first resistive state corresponds to a high resistance and non-conductivity and the second resistive state corresponds to a low resistance and conductivity.

5. The memory cell of claim 1, wherein the first or second selection layer returns to the first resistive state when the amount of current in the memory cell is less than the predetermined threshold.

6. The memory cell of claim 1, wherein the first or second selection layer consists of a chalcogenide.

7. The memory cell of claim 6, wherein the chalcogenide is Ge2Sb2Te5.

8. The memory cell of claim 1, wherein the RSE is a bipolar non-volatile memory device.

9. The memory cell of claim 2, wherein the metal-insulator transition material is doped with a material selected from the group consisting of chromium, titanium, and tungsten.

10. The memory cell of claim 2, wherein the metal-insulator transition material is selected from the group consisting of VO2, VO, VOx, and Ti2O3.

11. A data storage device, comprising:
a cross-point array of memory cells arranged in rows and columns, wherein a memory cell comprises a unipolar resistive sense element (RSE) coupled to at least one non-ohmic selection layer; and
a data access circuit capable of transitioning the selection layer from a first resistive state to a second resistive state by applying a current greater than or equal to a predetermined threshold to the memory cell, the selection layer remaining in the second resistive state after the current is reduced below the predetermined threshold.

12. The device of claim 11, wherein the at least one selection layer consists of a plurality of metal-insulator transition materials.

13. The device of claim 11, wherein the RSE consists of a non-volatile resistive random access memory (RRAM) cell.

14. The device of claim 11, wherein the RSE consists of a non-volatile spin-torque random access memory (STRAM) cell.

15. The device of claim 11, wherein the at least one selection layer is separated from the RSE by a barrier layer.

16. The device of claim 15, wherein the at least one selection layer, barrier layer, and RSE are disposed between a first and second electrode.

17. The device of claim 15, wherein the barrier layer concurrently contacts the at least one selection layer and the RSE on opposing sides and the barrier layer comprises a material selected from the group consisting of Ta, TaN, Ti, TiN, TiW, Titanium alloys, and Tantalum alloys.

18. A method comprising:
providing a memory cell comprising a unipolar resistive sense element (RSE) coupled to at least one unipolar non-ohmic selection layer;
transitioning the selection layer from a first resistive state to a second resistive state by applying a current greater than or equal to a predetermined threshold to the memory cell;
programming the RSE to a first logical state with a current from a first direction through the memory cell;
programming the RSE to a second logical state with a current from a second direction through the memory cell, the first direction opposite the second direction; and
transitioning the selection layer from the second resistive state to the first resistive state responsive to the current falling below a second predetermined threshold that is less than the first predetermined threshold.

19. The method of claim 18, wherein a first logical state is programmed to the RSE with the current while the selection layer is in the second resistive state.

20. The method of claim 18, wherein no current can pass through the memory cell while the selection layer is in the first resistive state.

* * * * *